(12) United States Patent
Jih-Fon et al.

(10) Patent No.: US 7,957,550 B2
(45) Date of Patent: Jun. 7, 2011

(54) FLEXIBLE ELECTRONIC DEVICE WITH FLEXIBLE SPEAKER

(75) Inventors: Huang Jih-Fon, Zhubei (TW); Chen Ming-Daw, Hsinchu (TW); Chiang Dar-Ming, Hsinchu (TW); Ko Wen-Ching, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 1522 days.

(21) Appl. No.: 11/086,331

(22) Filed: Mar. 23, 2005

(65) Prior Publication Data

US 2005/0254674 A1    Nov. 17, 2005

(30) Foreign Application Priority Data

Nov. 5, 2004  (TW) .............................. 93133733 A

(51) Int. Cl.
*H04R 25/00* (2006.01)
(52) U.S. Cl. ......... 381/334; 381/332; 381/333; 381/336
(58) Field of Classification Search .................. 381/87, 381/332–334, 386, 173, 190, 191
See application file for complete search history.

(56) References Cited

U.S. PATENT DOCUMENTS

| | | | | |
|---|---|---|---|---|
| 3,800,087 | A * | 3/1974 | Rybak | 381/67 |
| 5,558,957 | A * | 9/1996 | Datta et al. | 429/127 |
| 5,652,606 | A * | 7/1997 | Sasaki et al. | 345/204 |
| 6,137,675 | A * | 10/2000 | Perkins | 361/679.03 |
| 6,279,170 | B1 * | 8/2001 | Chu | 2/246 |
| 6,728,166 | B2 * | 4/2004 | Grupp | 368/69 |
| 7,229,385 | B2 * | 6/2007 | Freeman et al. | 482/4 |

* cited by examiner

*Primary Examiner* — Curtis Kuntz
*Assistant Examiner* — Jasmine Pritchard
(74) *Attorney, Agent, or Firm* — WPAT, PC; Justin King

(57) ABSTRACT

A flexible electronic device with flexible speaker is disclosed, comprising: a flexible printed circuit board (FPC), having a circuit layout arranged thereon; an input unit, electrically connected to the FPC for setting an information; a flexible speaker, electrically connected to the FPC for outputting the information; a display unit, electrically connected to the FPC for displaying the information; a power supply, electrically connected to the FPC for outputting the information for providing electricity to the FPC, the input device, the display device and the flexible speaker; a thin-film substrate; a film made of poly ethylene terephthalate (PET), referring as PET film hereinafter; wherein, the thin-film substrate completely cover the FPC, the power supply, and all the FPC, the input unit, the display unit, the power supply, the thin-film substrate and the flexible speaker are flexible.

23 Claims, 6 Drawing Sheets

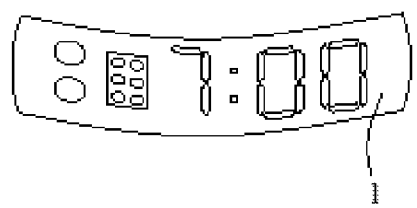
FIG. 7A
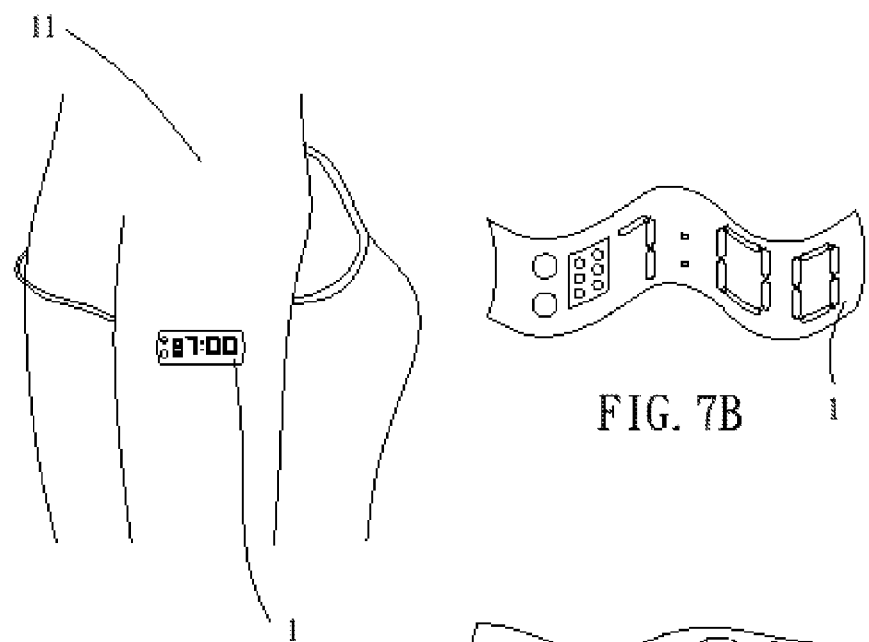
FIG. 7B
FIG. 8
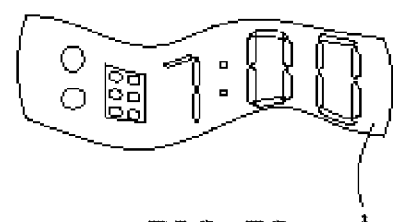
FIG. 7C

FLEXIBLE ELECTRONIC DEVICE WITH FLEXIBLE SPEAKER

FIELD OF THE INVENTION

The present invention relates to a flexible electronic device with flexible speaker, and more particular, to a flexible electronic device with flexible speaker capable of being attached onto a variety of curved surfaces.

BACKGROUND OF THE INVENTION

Nowadays, it is common for an electronic device to have a display arranged therein for interacting with users. Person Digital Assistant (PDA) is a typical electronic device having a liquid crystal display (LCD) arranged therein for displaying information. Similarly, it is quite common for an electronic device to have an input unit arranged therein, such as the touch screen integrally formed with the display of an electronic device, which acts as an input interface for the electronic device.

Generally, the display is the most bulky and heavy component in an electronic device. This is because that a liquid crystal display is substantially composed of a plurality of substrates, which are sophisticated and heavy. One of those substrates is an external substrate is usually made of glass. The glass substrate is pretty heavy while comparing with other components of the electronic device. In this regard, a PDA with LCD may be bulky and hefty due to the above mentioned physical characteristics of the LCD.

The display is also the most fragile component in an electronic device because of the sophisticated substrates. A display will not be able to operate while any one of the substrate is damaged or overly bended causing breakage of the substrate. That is, in case of a PDA is dropped on the floor by accident, the display of the PDA is most likely to be damaged by the force exerted thereon by the dropping, and thus causes the PDA malfunctioned.

The price tags are heavily used in department stores and wholesale markets, it is in great demand to have a flexible electronic device capable of being attached onto any curved surface for replacing the paper tags that can save cost and is also environmental friendly. Moreover, replacing the paper tags with the flexible electronic devices can save the consumption of paper and perform instant price change with respect to discount or exchange rate, it also can facilitate the achievement of e-commerce and distribution logistics. In addition, the thin, light-weighted, and portable characteristics of the flexible electronic devices enable the same to have a variety of usages, such as watch and clock. Further, if the flexible electronic device is fabricated with flexible speaker arranged therein enabling the same to have good audio and video performance, the flexible electronic device can even be applied in multimedia equipments.

SUMMARY OF THE INVENTION

It is the primary object of the invention to provide a flexible electronic device with flexible speaker, capable of being attached onto a curved surface for displaying outputted information of the electronic device.

To achieve the aforesaid object, the present invention provide a flexible electronic device with flexible speaker, comprising: a flexible printed circuit board (FPC), having a circuit layout arranged thereon; an input unit, electrically connected to the FPC for setting an information; a flexible speaker, electrically connected to the FPC for outputting the information; a display unit, electrically connected to the FPC for displaying the information; a power supply, electrically connected to the FPC for outputting the information for providing electricity to the FPC, the input device, the display device and the flexible speaker; a thin-film substrate; a film made of poly ethylene terephthalate (PET), referring as PET film hereinafter; wherein, the thin-film substrate completely cover the FPC, the power supply, and all the FPC, the input unit, the display unit, the power supply, the thin film substrate, and the flexible speaker are flexible.

In a preferred embodiment of the invention, the flexible electronic device with flexible speaker can be a watch or time indicator, having a thickness of less than 1 mm, wherein the device further comprising: a crystal oscillator (OSC), electrically connected to the FPC for providing accurate timing. In addition, the flexible electronic device with flexible speaker further has a PET film and an adhesive unit arranged on the surface of the device, and the power supply can be a lithium polymer battery.

Other objects, advantages and novel features of the present invention will become apparent upon study of the remaining portions of the specification and drawings.

BRIEF DESCRIPTION OF THE DRAWINGS

FIG. 7A, FIG. 7B and FIG. 7C are schematic illustrations showing deformation statuses of a flexible electronic device with flexible speaker according to the present invention.

FIG. 8 is a schematic illustration showing an application of a flexible electronic device with flexible speaker according to the present invention.

DESCRIPTION OF THE PREFERRED EMBODIMENT

Figure 1:
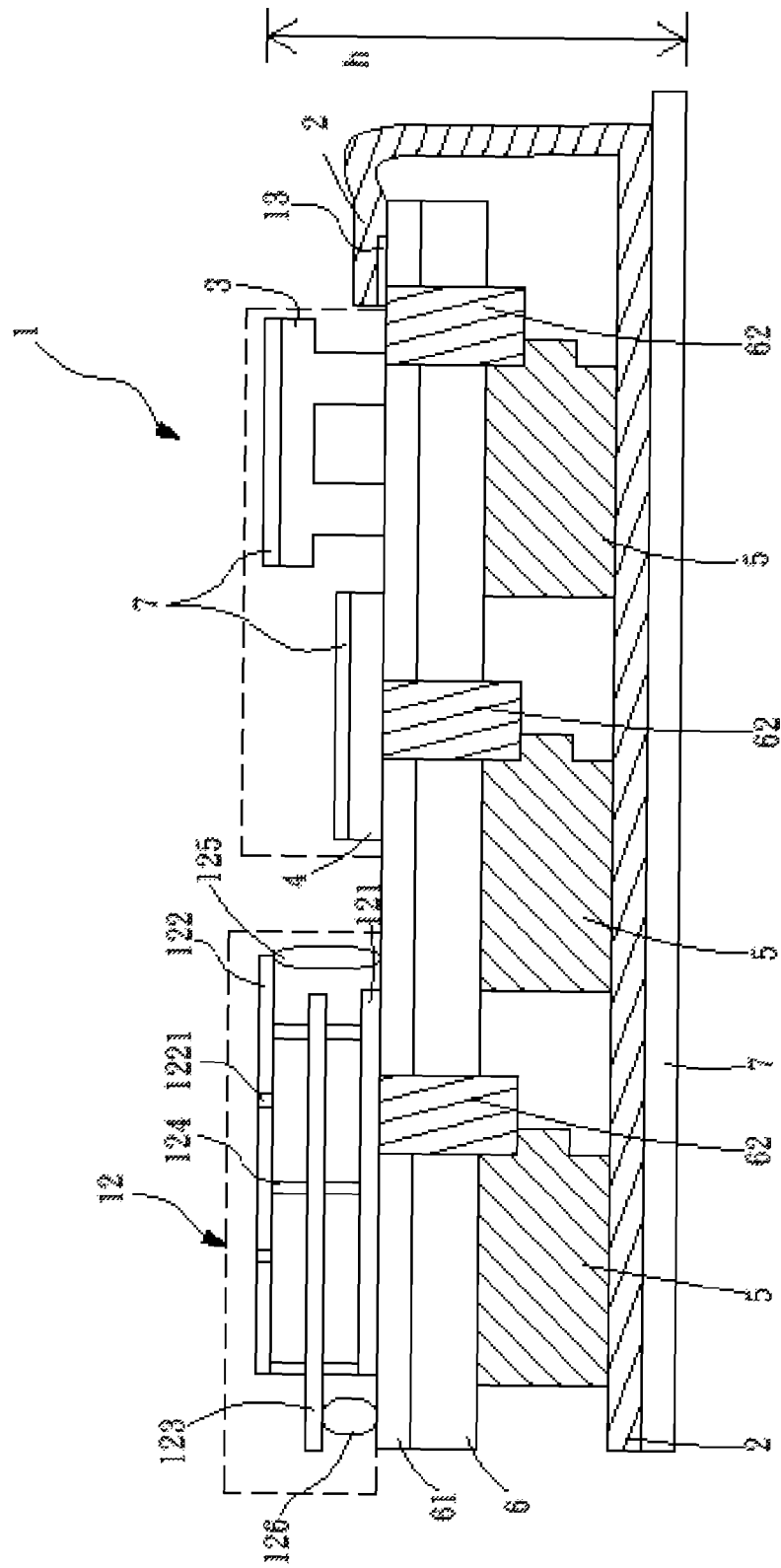
FIG. 1 is a sectional view of a flexible electronic device with flexible speaker according to the present invention.

Please refer to FIG. 1, which is a sectional view of a flexible electronic device with flexible speaker according to the present invention. As seen in FIG. 1, the flexible electronic device with flexible speaker 1 comprises: a FPC 2, having a circuit layout 13 disposed thereon; a metal foil 6, having a thin-film substrate 61 disposed thereon and a plurality of electrodes 62 arranged therein; an input unit 3, electrically connected to the FPC 2 by way of the plural electrodes 62 for setting an information; a display unit 4, electrically connected to the FPC 2 by way of the plural electrodes 62 for displaying the information; an electret condenser speaker 12, electrically connected to the FPC 2 by way of the silver glues 125 and 126 for outputting the information; a power supply 5, electrically connected to the FPC 2 via the plural electrodes 62 for providing electricity to the FPC 2, the input unit 3, the display unit 4, the PET film 7, and electret condenser speaker 12. A PET film 7 protects the flexible electric device 1 by covering on the surface of the flexible electric device 1. Both the metal foil 6 and the thin film substrate 61 cover the FPC 2 and also completely cover the power supply 5.

Moreover, the electret condenser speaker 12 further comprises: a first ferroelectret layer 121, being disposed on the thin-film substrate 61; a second ferroelectret layer 122 having a plurality of acoustic holes 1221 arranged thereon, being electrically connected to the FPC 2 via the silver glue 125 and the thin film substrate 61; a polymer dielectric diaphragm 123, having a conductive layer coated thereon and sandwiched between the first ferroelectret layer 121 and the second ferroelectret layer 122, being electrically connected to the FPC 2 by using the silver glue 126; and a plurality of spacers 124. Some of the spacers 124 are evenly disposed and sandwiched between the first ferroelectret layer 121 and the polymer dielectric diaphragm 123; some of the spacers are evenly disposed and sandwiched between the polymer dielectric diaphragm 123 and the second ferroelectret layer 122.

In a preferred embodiment of the invention, the electret condenser speaker 12 can be an unidirectional electret condenser speaker, in addition, the flexible electronic device 1 is characterized in that: all the FPC 2, the input unit 3, the display unit 4, the power supply 5, the metal foil 6, the PET 7 and the electret condenser speaker 12 are flexible, and the total thickness h of the device 1 is less than 5 mm.

The spacers 124 functioned for separating the first ferroelectret layer 121 from the polymer dielectric diaphragm 123 and the second ferroelectret layer 122 from the polymer dielectric diaphragm 123 are capable of preventing the polymer dielectric diaphragm 123 from coming into contact with either the first ferroelectret layer 121 or the second ferroelectret layer 122. In one aspect of the invention that there is no spacer 124 arranged in the speaker 12 of the flexible electronic device 1 if the device 1 is small enough, which requires no consideration of bending. Moreover, the spacers can be arranged either only between the first ferroelectret layer 121 and the polymer dielectric diaphragm 123, or only between the polymer dielectric diaphragm 123 and the second ferroelectret layer 122.

For the electret condenser speaker 12 of FIG. 1, the relation between force (F) and voltage (V) can be represented using the formula list as following"

$$F = C \cdot A \cdot V \cdot v / d^2$$

where F is the force exerted on or releasing by the electret condenser speaker 12;
C is a constant;
A is the reception area of the electret condenser speaker 12;
V is an external AC voltage or a generated voltage;
v is the internal electrostatic voltage between the first ferroelectret layer 121 and the second ferroelectret layer 122, i.e. the first ferroelectret layer 121 and the second ferroelectret layer 122 are both electrets and each has a voltage of +v, and the polymer dielectric diaphragm 123 has a voltage of −v;
d is an air gap represented by the distance between the first ferroelectret layer 121 and the polymer dielectric diaphragm 123, i.e. the height of the space 124;

Therefore, while the speaker 12 is subjected to an external voltage, the speaker is enabled to radiate sound. Similarly, the speaker 12 is also capable of functioning as a microphone; while the speaker 12 is subjected to a force exerted by a user speaking to the reception area of the speaker 12, the speaker 12 is capable of transforming the force into voltage and further converting the voltage into a series of signals.

Figure 2:
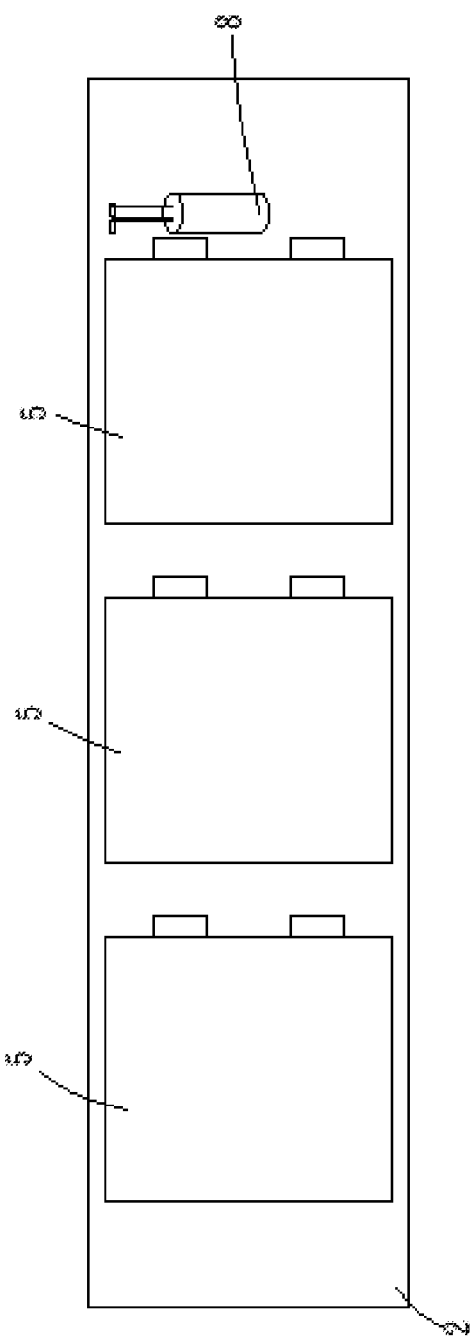
FIG. 2 is a partially top view of a flexible electronic device with flexible speaker according to the present invention.
Figure 3:
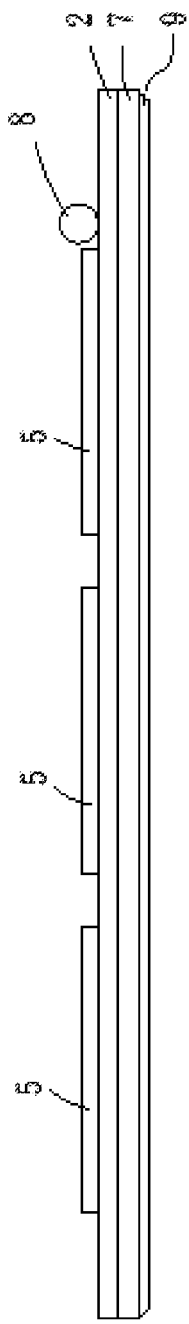
FIG. 3 is a partially side view of a flexible electronic device with flexible speaker according to the present invention.

Please refer to FIG. 2 and FIG. 3, which are respectively a partially top view and a partially side view of a flexible electronic device with flexible speaker according to the present invention. As seen, the flexible electronic device 1 of the invention further comprises: a crystal oscillator 8, electrically connected to the FPC 2 for providing the device with accurate timing and enabling the flexible device 1 to act as a watch or time indicator; and an adhesive unit 9, for enabling the device to be attached onto a curved surface so as to increase the usage variety and convenience of the flexible electronic device 1; wherein the adhesive unit 9 can be a component selected from the group consisting of convenient glue, Velcro tape and magnetic set. Moreover, the OSC can be voided in the flexible electronic device 1 while accurate timing is not required.

Figure 4A:
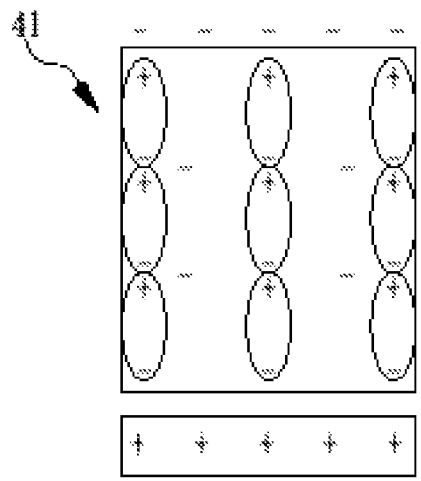
FIG. 4A is a section view showing a current structure of the ferroelectret layer of a flexible electronic device with flexible speaker according to the present invention.
Figure 4B:
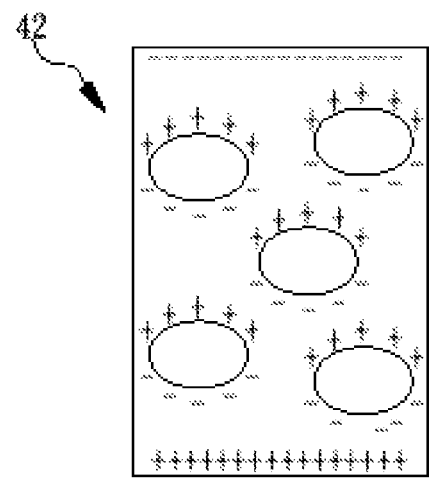
FIG. 4B is a section view showing an anticipated structure of the ferroelectret layer of a flexible electronic device with flexible speaker according to the present invention.

Please refer to FIGS. 4A and 4B, which are section views respectively showing a current structure and an anticipated structure of the ferroelectret layer of a flexible electronic device with flexible speaker according to the present invention. The ferroelectret layer 41 and the ferroelectret layer 42 respectively shown in FIGS. 4A and 4B are made of electret, i.e. both are made of a solid dielectric, that exhibits persistent dielectric polarization, capable of maintaining a long-lived electrostatic charge therein. The structure of the current ferroelectret layer 41 as seen in FIG. 4A will evolve into the structure of the ferroelectret layer 42 as seen in FIG. 4B, where the ferroelectret layer 42 has a plurality of nano-porous for storing static charges therein, and is made of ferroelectret composed of fluoropolymer VDF-HFP-TFE and the like for enabling the ferroelectret layer to have merits of high charge storage capability, preferred physical quality, and cheap cost.

Figure 4C:
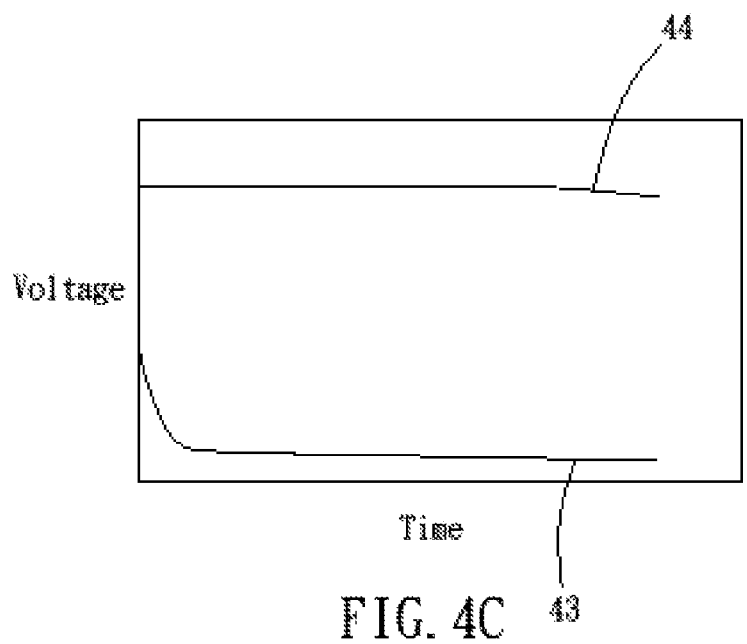
FIG. 4C is a schematic diagram showing the relationship of voltage versus time with respect to the ferroelectret layer of a flexible electronic device with flexible speaker according to the present invention.

Please refer to FIG. 4C, which is a schematic diagram showing the relationship of voltage versus time with respect to the ferroelectret layer of a flexible electronic device with flexible speaker according to the present invention. The operation of the ferroelectret layer 41 of FIG. 4A is represented by the function curve 43 and the operation of the ferroelectret layer 42 of FIG. 4B is represented by the function curve 44. As seen in FIG. 4C, the static charge stored in the ferroelectret layer 41 as at time 0 will decay along with the progress of time while the static charge stored in the ferroelectret layer 42 can remain almost unchanged, that is, the final voltage of the ferroelectret layer 41 is about 100 V while the finally steady voltage of the ferroelectret layer 42 can be maintained at 1000 V. By virtue of this, the anticipated structure of the ferroelectret layer 42 shown in FIG. 4B can store and maintain high voltage therein with less decay such that the electret speaker using the same can maintain a preferred efficiency during a comparative longer period.

Figure 5:
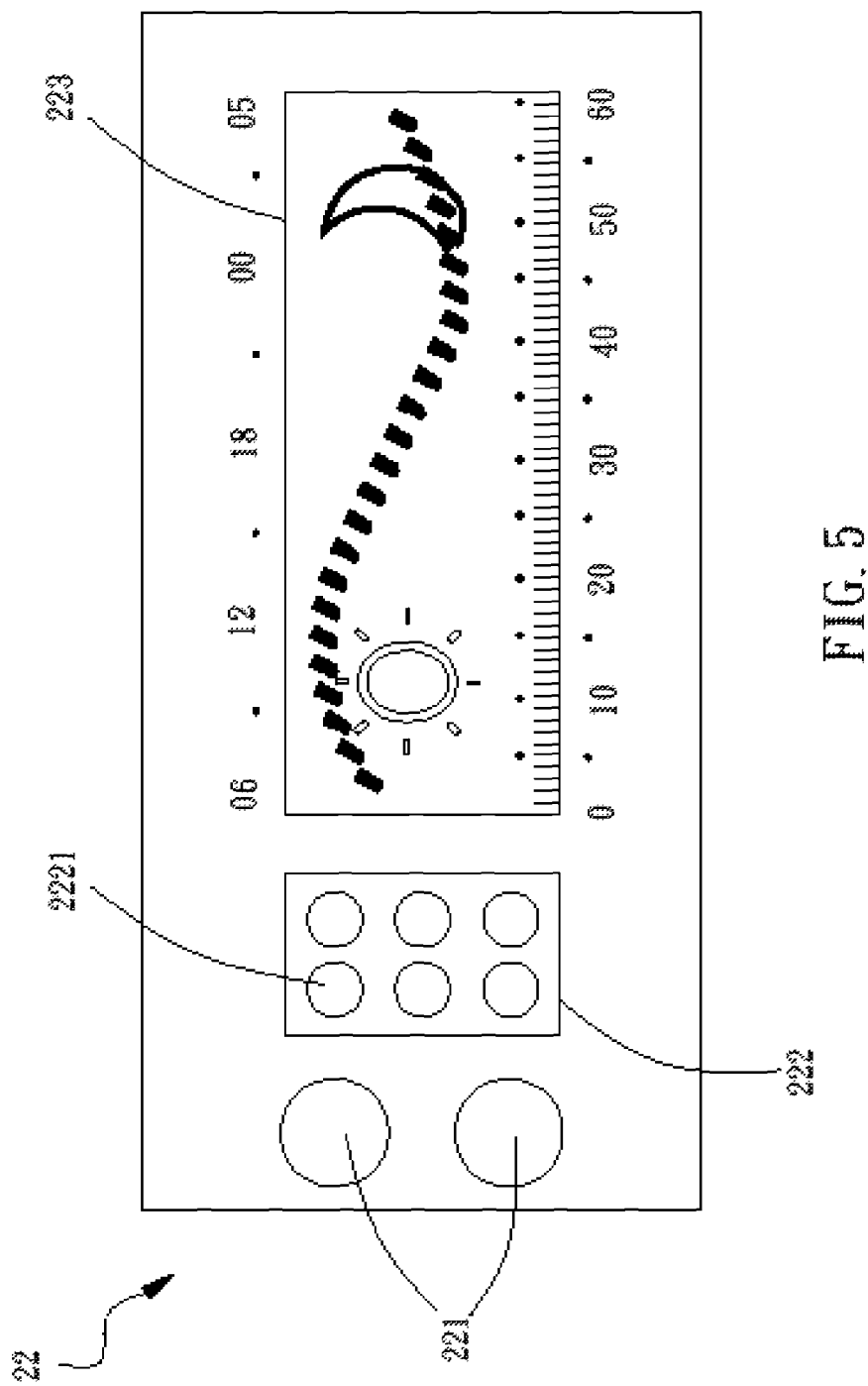
FIG. 5 is a schematic view of a flexible electronic device with flexible speaker according to a preferred embodiment of the present invention.

Please refer to FIG. 5, which is a schematic view of a flexible electronic device with flexible speaker according to a preferred embodiment of the present invention. The flexible electronic device with flexible speaker 22 is substantially a watch, comprising: a keypad 221, capable of being used by a user to input data; a speaker/microphone 222, having a plurality of transmitter/receiver 2221 arranged therein for inputting/outputting audio data, and a display panel 223, for displaying video data to the user; wherein the keypad 221, the speaker/microphone 222 and the display panel 223 are all flexible. Moreover, the open area ratio of speaker/microphone 222 is ranged between 15% and 20%, which may be otherwise determined by the specifications of a user (e.g. the magnitude of input power/output power).

Figure 6:
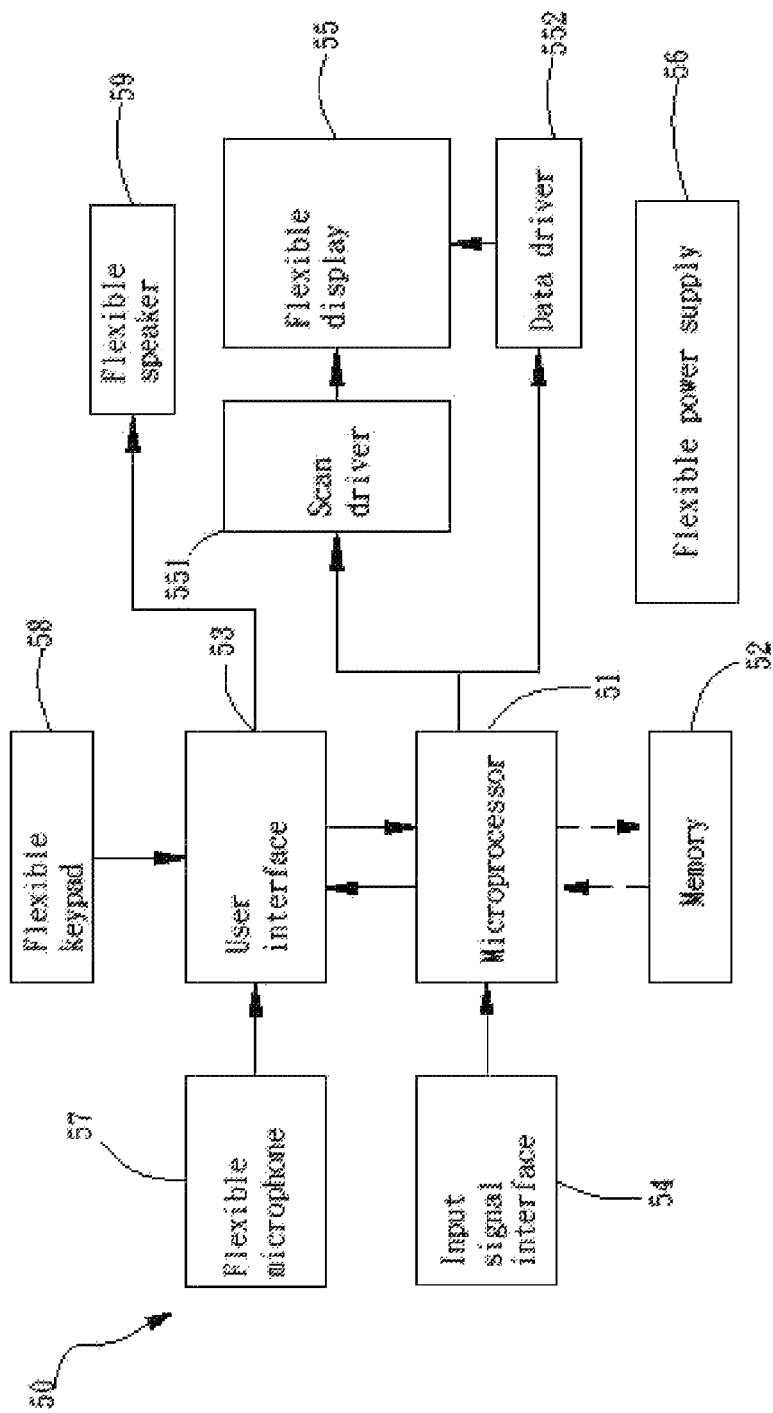
FIG. 6 is a function block diagram showing a flexible electronic device with flexible speaker according to the present invention.

FIG. 6 is a function block diagram showing a flexible electronic device with flexible speaker according to the present invention, wherein the arrows show the direction of data flow. The flexible electronic device with flexible speaker 50 comprises a microprocessor 51, a memory 52, an user interface 53, an input signal interface 54, a flexible display 55, a scan driver 551, a data driver 552, a flexible power supply 56, a flexible microphone 57, a flexible keypad 58, and a flexible speaker 59, wherein the flexible microphone 57, the flexible keypad 58, and a flexible speaker 59 are electrically connected to the user interface 53; the memory 52, the user interface 53, the input signal interface 54, the scan driver 551, and the data driver are electrically connected to the microprocessor 51; the flexible display 55 is electrically connected to the scan driver 551 and the data driver 552; and the flexible power supply 56 is capable of providing electricity to the microprocessor 51, the memory 52, the user interface 53, the input signal interface 54, the flexible display 55, the scan driver 551, the data driver 552, the flexible microphone 57, the flexible keypad 58, and the flexible speaker 59.

In operational, a data is inputted to the device 50 by way of the flexible microphone 57 and/or the flexible keypad 58, and then the inputted data is progressed to the user interface 53 where it is directed to the microprocessor 51. Nevertheless, data received by the microprocessor 51 can be coming from the input signal interface 54, or can be the data stored in the memory 52 and transmitted therefrom. Following, after the inputted data is processed by the microprocessor 51, the inputted data is processed and divided into auto data, being sent to the user interface 53 for redirecting the same to the flexible speaker 59, and video data, being sent to the scan driver 551 and the data driver 552 in respective for displaying by the flexible display 55 by way of the cooperative operation of the two drivers 551 and 552.

FIG. 7A, FIG. 7B and FIG. 7C are schematic illustrations showing deformation statuses of a flexible electronic device with flexible speaker according to the present invention. The flexible electronic device with flexible speaker 1 can be bended at will without causing malfunction of the same, such that the device 1 can be attached onto the surfaces of all kinds of objects.

Please refer to FIG. 8, which is a schematic illustration showing an application of a flexible electronic device with flexible speaker according to the present invention. In this embodiment, the flexible electronic with flexible speaker 1 is substantially a time indicator, which is capable of being attached onto human skin 11 by convenient glue. The characteristics of light-weight and small-sized possessed by the flexible device 1 of FIG. 8 enabling the flexible electronic device 1 to be portable, further, since every components used for composing the flexible device 1 of FIG. 8 are flexible, such that the flexible electronic device 1 can be attached onto surfaces of any shapes and materials.

In another preferred embodiment of the invention, the input unit is integrally formed with the PET film of the display unit, that is, the input unit and display device are integrally fabricated to be seamless for improving surface flatness of the flexible electronic device of the invention along with isolating the same from external pollutants, such as moisture and dust.

Yet, in another embodiment of the invention, the circuit layout can by disposed on the display unit by low temperature poly silicon (LTPS) process, such that the circuit layout can be voided on the FPC. In addition, the metal foil can also be voided since it is only used for conducting electricity.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A flexible electronic device with flexible speaker, comprising:
    a flexible printed circuit board (FPC);
    an input unit, electrically connected to the FPC for setting a data including a video data and an audio data;
    a display unit, electrically connected to the FPC for outputting the video data;
    a flexible speaker, electrically connected to the FPC for outputting the audio data;
    a power supply, electrically connected to the FPC for providing electricity to the FPC, the input unit, the display unit, the flexible speaker; and
    a thin-film substrate, covering the FPC and the power supply completely;
    wherein, the FPC, the input unit, the display unit, the flexible speaker, the power supply, and the thin-film substrate are all flexible;
    wherein the FPC directly connects electrically to the power supply and the thin-film substrate.

2. The device as recited in claim 1, the device further comprising a crystal oscillator (OSC), electrically connected to the FPC for providing accurate timing.

3. The device as recited in claim 1, wherein a film made of poly ethylene terephthalate, referring as PET film, is disposed on the surface of the flexible electronic device with flexible speaker.

4. The device as recited in claim 3, wherein the PET film is integrally formed.

5. The device as recited in claim 1, wherein a circuit layout arranged on the FPC is connected to the power supply for enabling the power supply to provide electricity to the FPC, the input unit, the display unit, and the flexible speaker.

6. The device as recited in claim 1, wherein a circuit layout arranged on the display unit is connected to the power supply for enabling the power supply to provide electricity to the FPC, the input unit, the display unit, and the flexible speaker.

7. The device as recited in claim 1, wherein the display unit is an active display.

8. The device as recited in claim 7, wherein the active display is an organic light-emitting device (OLED).

9. The device as recited in claim 7, wherein the active display is an active-matrix liquid crystal display (AMLCD).

10. The device as recited in claim 1, wherein the display unit is a passive display.

11. The device as recited in claim 1, wherein the power supply is a polymer battery.

12. The device as recited in claim 1, wherein the polymer battery is a lithium polymer battery.

13. The device as recited in claim 1, the flexible electronic device further comprising an adhesive unit coupling to the same, capable of being attached onto a curved and rugged surface.

14. The device as recited in claim 13, wherein the adhesive unit is substantially composed of convenient glue.

15. The device as recited in claim 13, wherein the adhesive unit is substantially composed of Velcro tape.

16. The device as recited in claim 13, wherein the adhesive unit is substantially composed of magnetic set.

17. The device as recited in claim 1, wherein the total thickness of the flexible electronic device with flexible speaker is less than 5 mm.

18. The device as recited in claim 1, the FPC is a COP (Chip-On-Film).

19. The device as recited in claim 1, a metal foil is sandwiched between the thin-film substrate and the power supply.

20. The device as recited in claim 1, wherein the flexible speaker further comprises:
- a first ferroelectret layer, disposed on the thin-film substrate, being electrically connected to the FPC by way of a silver glue;
- a polymer dielectric diaphragm, having a conductive layer coated thereon and being disposed over the first ferroelectret layer without coming into contact with the first ferroelectret layer; and
- a second ferroelectret layer, disposed over the polymer dielectric diaphragm without coming into contact with the polymer dielectric diaphragm, being electrically connected to the FPC by way of another silver glue.

21. The device as recited in claim 20, wherein the flexible speaker further comprises at least a spacer, being sandwiched between the first ferroelectret layer and the polymer dielectric diaphragm.

22. The device as recited in claim 20, wherein the flexible speaker further comprises at least a spacer, being sandwiched between the polymer dielectric diaphragm and the second ferroelectret layer.

23. The device as recited in claim 20, wherein the flexible speaker further comprises: at least a first spacer, being sandwiched between the first ferroelectret layer and the polymer dielectric diaphragm; and at least a second spacer, being sandwiched between the polymer dielectric diaphragm and the second ferroelectret layer.

* * * * *